US009426910B1

(12) United States Patent
Lee

(10) Patent No.: US 9,426,910 B1
(45) Date of Patent: Aug. 23, 2016

(54) TRANSMISSION CABLE FOR ELECTRICAL DEVICES

(71) Applicant: Rich Electric Wire and Cable Co. Ltd., Yunlin County (TW)

(72) Inventor: Chang-Chi Lee, Yunlin County (TW)

(73) Assignee: RICH ELECTRIC WIRE AND CABLE CO. LTD., Yunlin County (TW)

( * ) Notice: Subject to any disclaimer, the term of this patent is extended or adjusted under 35 U.S.C. 154(b) by 0 days.

(21) Appl. No.: 14/613,131

(22) Filed: Feb. 3, 2015

(51) Int. Cl.
*H05K 5/03* (2006.01)
*H05K 5/02* (2006.01)
*H05K 5/00* (2006.01)
*H01R 13/62* (2006.01)

(52) U.S. Cl.
CPC .......... *H05K 5/0247* (2013.01); *H01R 13/6205* (2013.01); *H05K 5/0086* (2013.01); *H05K 5/0208* (2013.01)

(58) Field of Classification Search
CPC ..... H05K 5/02; H05K 5/0247; H01R 13/6205
USPC .................................................... 206/38, 702
See application file for complete search history.

(56) References Cited

U.S. PATENT DOCUMENTS 7,942,691 B1 * 5/2011 McSweyn .............. H01R 13/72 439/501
8,061,513 B2 * 11/2011 Shanahan, Sr. ........... A61J 1/03 206/307
8,714,358 B2 * 5/2014 Debitzky ............. H04R 1/1033 206/409
2010/0072106 A1 * 3/2010 Wang ....................... A45F 5/004 206/702
2011/0159706 A1 * 6/2011 Wu .................... H01R 13/6205 439/39
2012/0071008 A1 * 3/2012 Sessford ............ H01R 13/6205 439/39
2012/0178270 A1 * 7/2012 McElroy ................ H01R 13/22 439/39
2012/0252231 A1 * 10/2012 Kall ................... H01R 13/6205 439/39
2012/0295472 A1 * 11/2012 McSweyn .............. H01R 13/60 439/501
2012/0329293 A1 * 12/2012 Wang ..................... H01R 13/60 439/40
2013/0187606 A1 * 7/2013 Ting ...................... H02J 7/0042 320/114
2013/0224976 A1 * 8/2013 Yu .......................... H01R 35/02 439/164
2013/0267101 A1 * 10/2013 Furness .............. H01R 13/6205 439/39
2013/0313157 A1 * 11/2013 Pollack ................ H05K 5/0278 206/702
2015/0015204 A1 * 1/2015 Sorias ................... H02J 7/0042 320/111
2015/0018049 A1 * 1/2015 Baschnagel ............. H04M 1/04 455/573

* cited by examiner

*Primary Examiner* — Hung V Ngo
(74) *Attorney, Agent, or Firm* — Ming Chow; Sinorica, LLC

(57) ABSTRACT

A transmission cable for an electrical device includes a first case, a second case, a line, a first connector and a second connector. The second case is detachably connected to the first case, and a space is formed between the first case and the second case when the first case is connected to the second case. The line having opposite ends connected to the first case and the second case respectively, and the first connector is connected to the end of the line connected to the first case while the second connector is connected to the end of the line connected to the second case. Both the first connector and the second connector are received in the space between the first case and the second case when the first case is connected to the second case for storage.

6 Claims, 8 Drawing Sheets

TRANSMISSION CABLE FOR ELECTRICAL DEVICES

BACKGROUND OF THE INVENTION

1. Technical Field

The present invention relates generally to power transmission to an electrical device, and more particularly to a transmission cable for electrical devices.

2. Description of Related Art

Typically, USB cables are widely used in electrical devices for power and/or signals transmission. A conventional USB cable includes two USB connectors at opposite ends to be connected to two different electrical devices. When the USB cable is disconnected and stored, the USB connectors are exposed anyway, so that the USB connectors would be damaged, deformed by impact, or stained with dirt.

Take a charger for electronic devices, such as cellular phones and tablets, it has a line with a USB connector at an end, and a transformer with a plug at the other end for power transmission. the same problem as above, the USB connector is exposed all the time to get the damage and dirt problems. Furthermore, the line usually has a constant length that is different for storage.

BRIEF SUMMARY OF THE INVENTION

In view of the above, the primary objective of the present invention is to provide a transmission cable for electrical devices, which can be stored to protect the connector(s) thereon.

The present invention provides a transmission cable for an electrical device, including a first case, a second case, a line, a first connector and a second connector. The second case is detachably connected to the first case, and a space is formed between the first case and the second case when the first case is connected to the second case. The line having opposite ends connected to the first case and the second case respectively, and the first connector is connected to the end of the line connected to the first case while the second connector is connected to the end of the line connected to the second case. Both the first connector and the second connector are received in the space between the first case and the second case when the first case is connected to the second case.

Whereby, in operation, the first and the second connectors could be pulled out to be connected to the predetermined electrical devices, and the first and the second connectors are hidden in the space between the first and the second cases in storage. The left line could be hung on a specific place.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
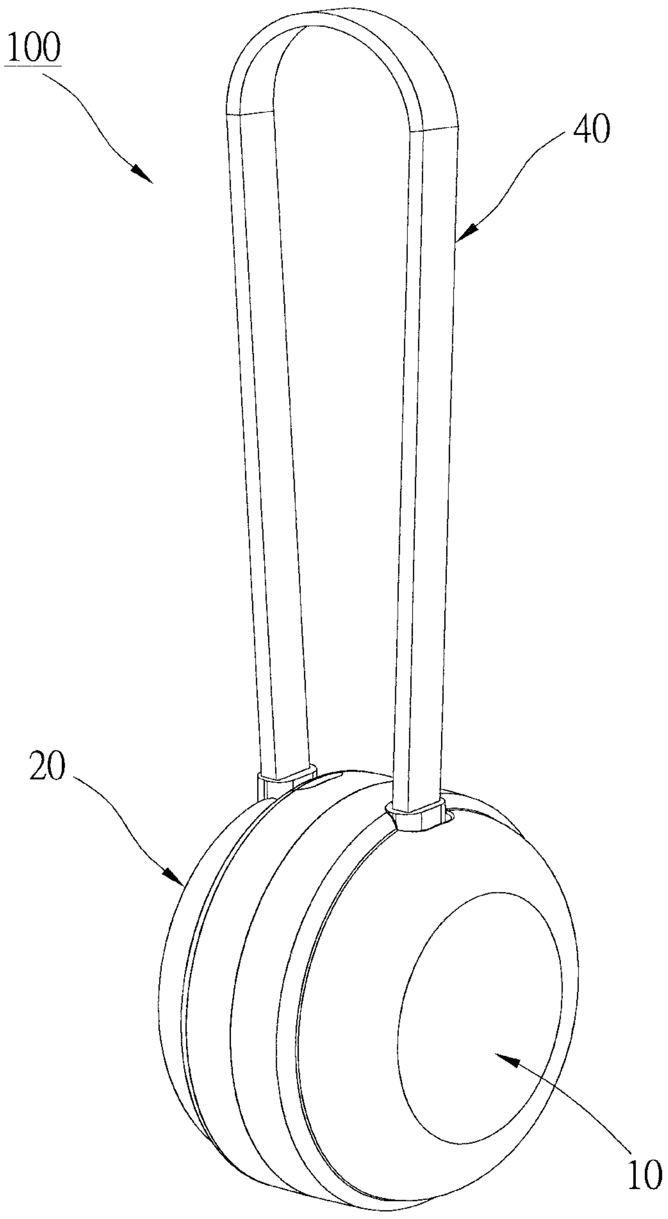
FIG. 1 is a perspective view of a preferred embodiment of the present invention.
Figure 2:
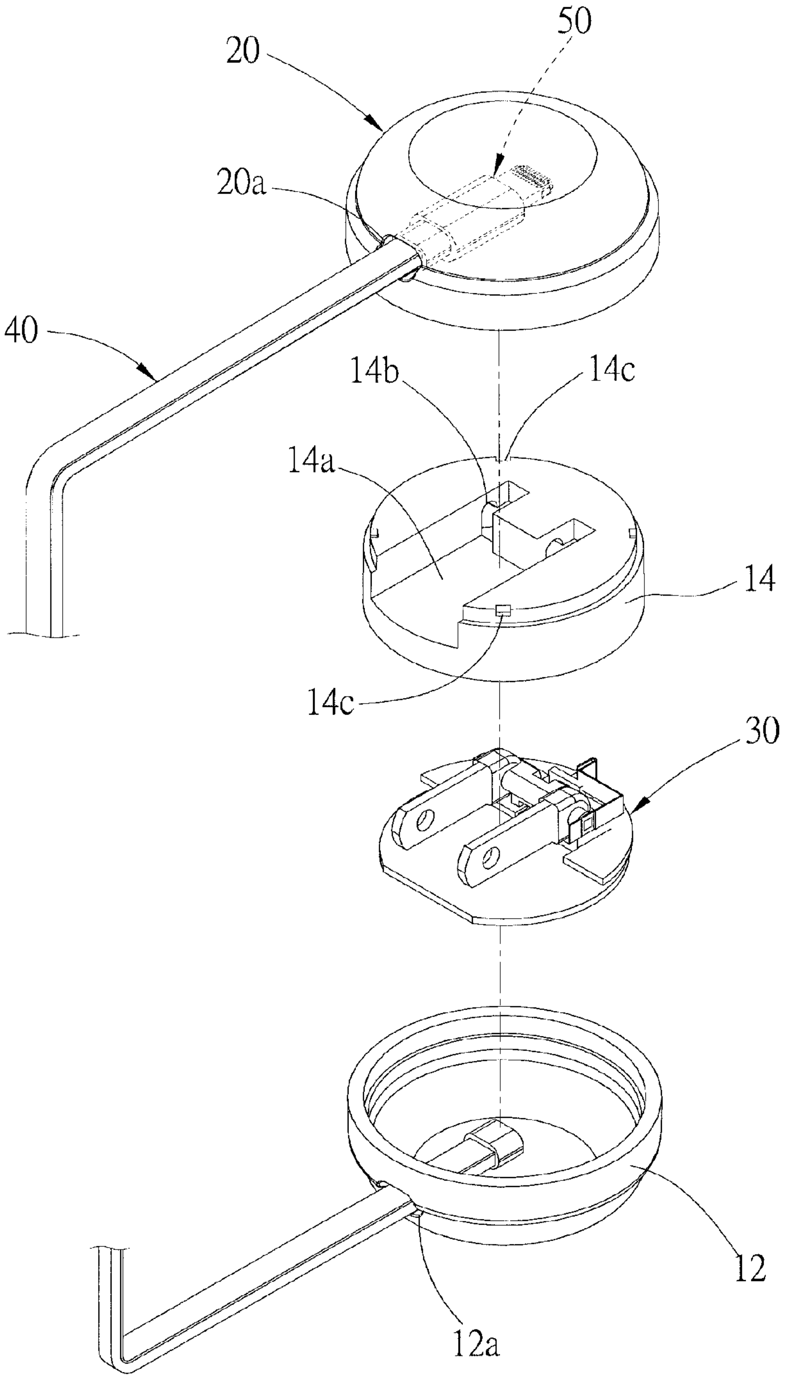
FIG. 2 is an exploded view of the preferred embodiment of the present invention.
Figure 3:
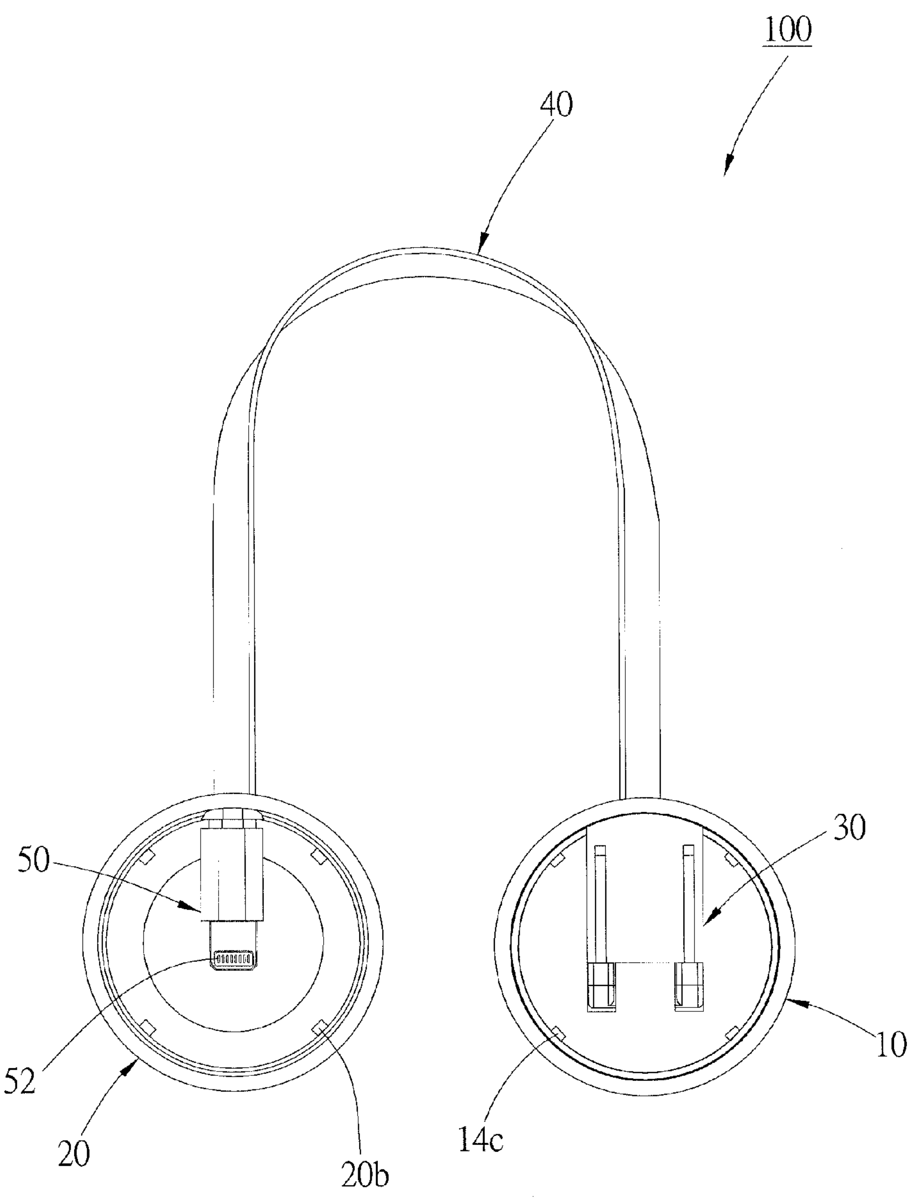
FIG. 3 is another perspective view of the preferred embodiment of the present invention, in which the first case and the second case are disconnected.

As shown in FIG. 1 to FIG. 3, a transmission cable 100 of the preferred embodiment of the present invention includes a first case 10, a second case 20, a first connector 30, a line 40, and a second connector 50. The transmission cable 100 could be applied in electric-power transmission and/or signal transmission between two electrical devices. In the present embodiment, the transmission cable 100 is a charge for mobile electronic devices, wherein the first connector 30 has a two-pined plug, and the second connector 50 has a USB plug.

Figure 4:
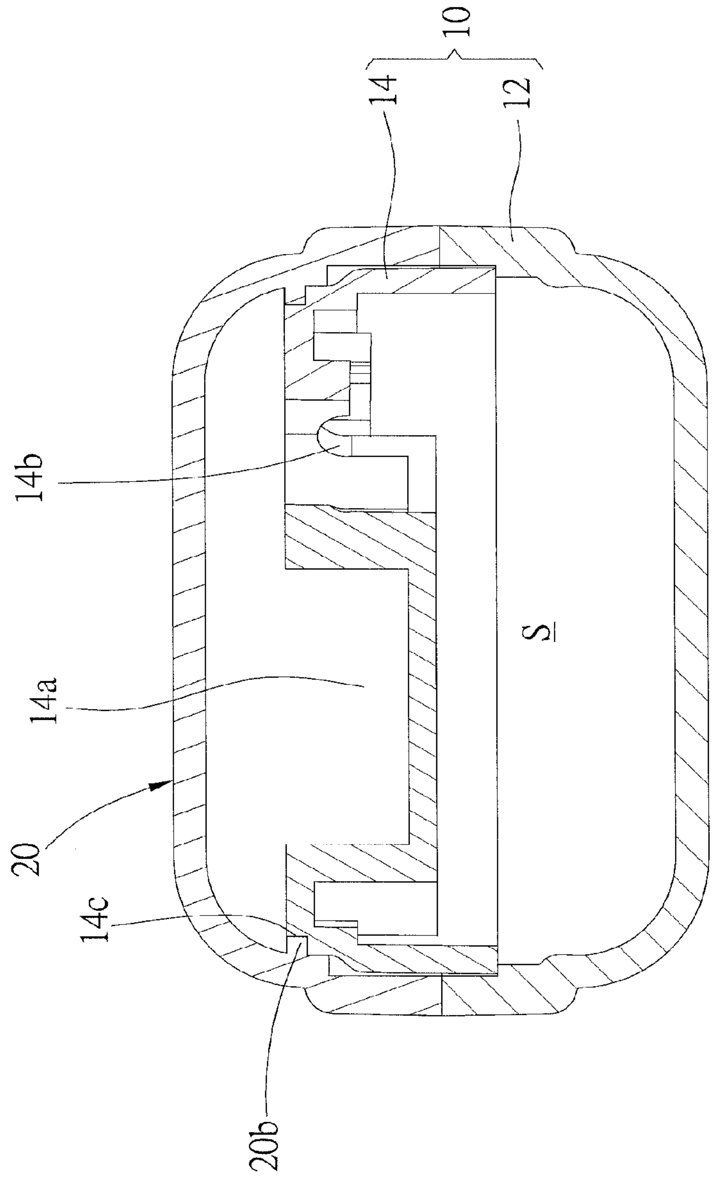
FIG. 4 is a sectional view of the preferred embodiment of the present invention, in which the first case and the second case are connected.

The first case 10 is made of plastic, having an outer member 12 and an inner member 14. As shown in FIG. 4, the outer member 12 is connected to the inner member 14 to form a chamber S therebetween. A way of connecting the outer and the inner members 12, 14 includes interference fitting, gluing, and high frequency heating, and so on. The outer member 12 has a line bore 12*a* communicated with the chamber S. The inner member 14 has a recess 14*a* at an outer side, two bores 14*b* on a sidewall of the recess 14*a*, and a plurality of mortise 14*c*. The bores 14*b* communicate the chamber S with the recess 14*a*.

The second case 20 is made of plastic as well, having a line bore 20*a* and a plurality of tenons 20*b*. As shown in FIG. 4, the tenons 20*b* are projected from an outer side of the second case 20, and respectively engage the mortise 14*c* of the first case 10 to firmly connect the first and the second case 10, 20 together. On the contrary, the first and the second case 10, 20 are disconnected while a user exerts to disengage the tenons 20*b* with the mortise 14*c*. It is noted that the first and the second case 10, 20 could be made of any material other than plastic.

Figure 5:
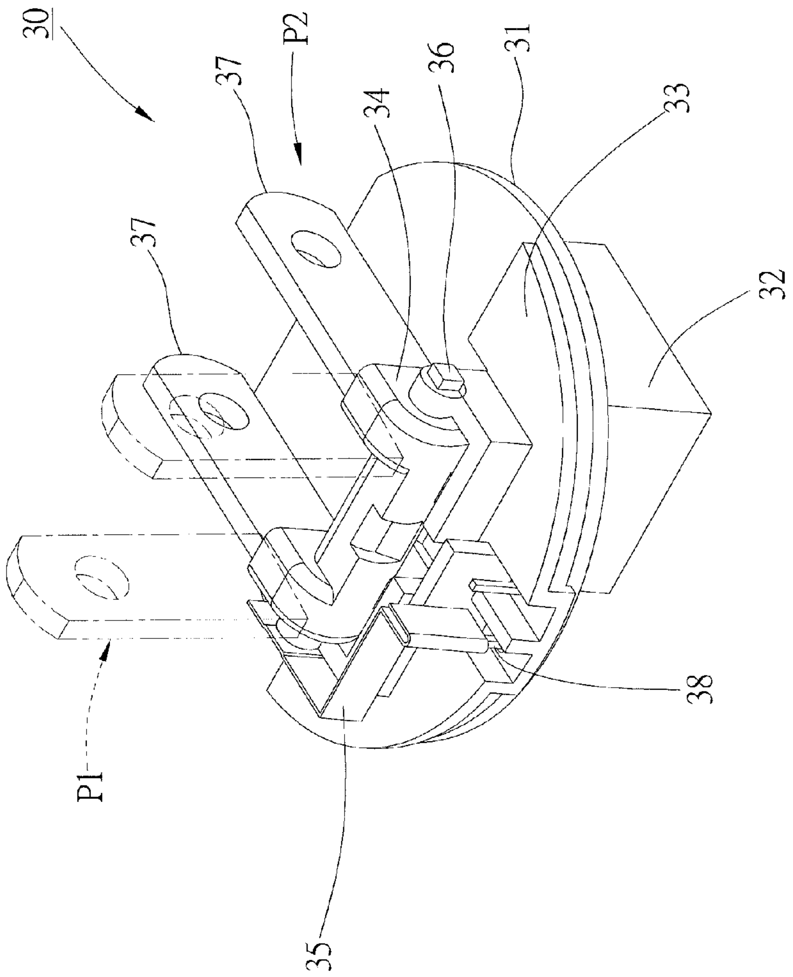
FIG. 5 is a perspective view of the first connector of the preferred embodiment of the present invention.

As shown in FIG. 5, the first connector 30 has a circuit board 31, a transformer 32, an insulating board 33, a pivoting base 34, a conductive plate 35, and a plug. The insulating board 33 and the transformer 32 are mounted on opposite sides the circuit board 31 while the pivoting base 34 is pivoted on the insulating board 33 for swinging, and the conductive member 35 is mounted on the insulating board 33. The plug has a first conductive pin 36 and two power pins 37. The power pins 37 are parallel to each other, and inserted into slots on the pivoting base 34. The first conductive pin 36 is inserted into the insulating board 33 and the pivoting base 34 to pivot the pivoting base 34 on the insulating board 33. The first conductive pin 36 is electrically connected to the power pins 37 in the, pivoting base 34 and the conductive plate 35 respectively contacts an end of the conductive pin 36 and a second conductive pin 38, which is connected to the circuit board 31, so that the power pins 37 are electrically connected to the circuit board 31. It is noted that the conductive plate 35 is bent to form a U-shaped portion, and the second conductive pin 38 is clipped by the U-shaped portion.

The circuit board 31 and the transformer 32 are received in the chamber S of the first case 10, and the power pins 37 extend out of the inner member 14 through the bores 14*b* to be moved between an operation position P1 and a storage position P2. In the operation position P1 the power pins 37 are substantially perpendicular to the inner member 14 to be inserted into a socket (not shown) of a power supply. In the storage position P2, the power pins 37 are swung toward the inner member 14 to be received in the recess 14*a*.

Figure 6:
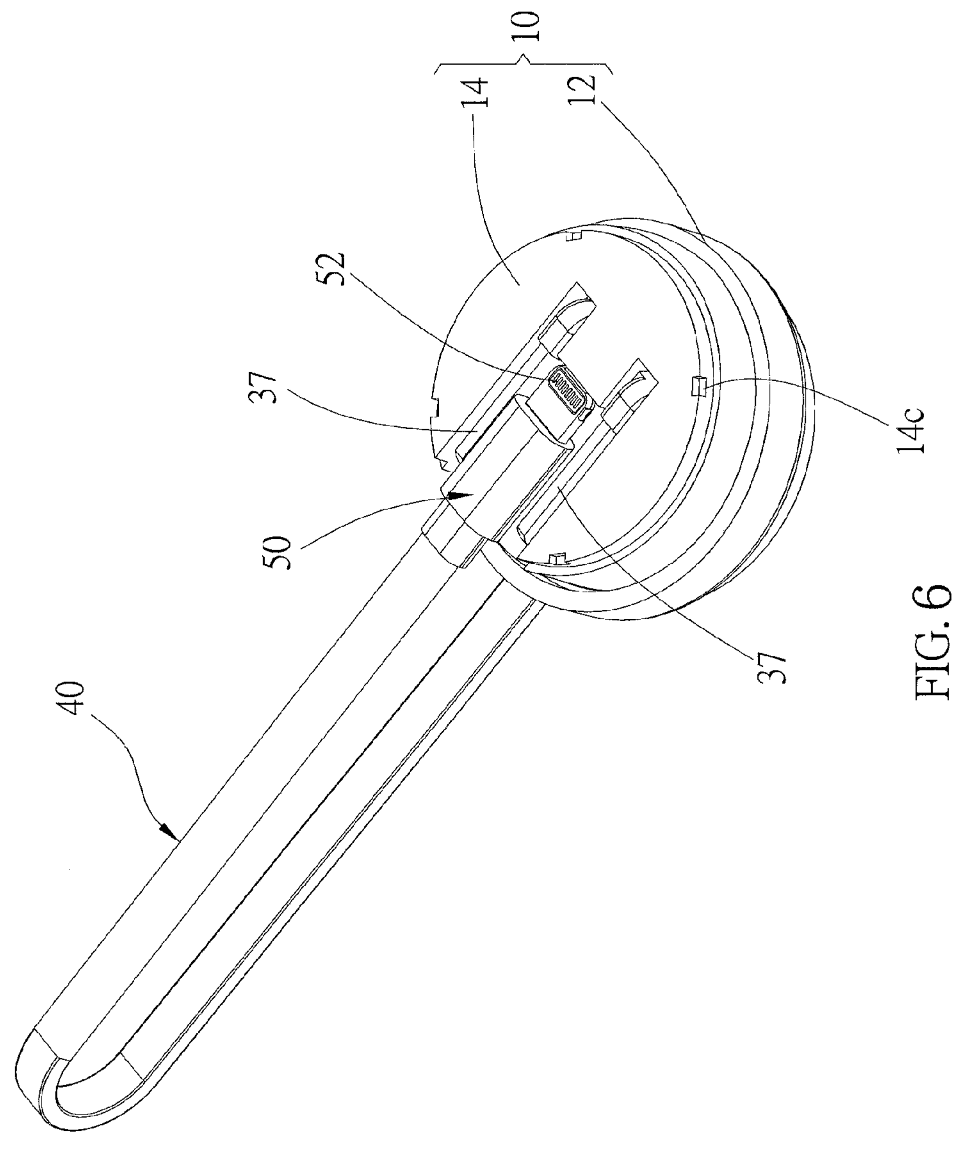
FIG. 6 is a perspective view of the preferred embodiment of the present invention, showing the second connected between the pins of the first connector.

The line 40 has an end inserted into the line bore 12*a* of the first case 10 to be electrically connected to the circuit board 31, and the other end of the line 40 is inserted into the line bore 20*a* of the second case 20 to be electrically connected to the second connector 50. The USB plug of the second connector 50 has pins 52, and the second connector 50 is received in the recess 14*b* and in a space between the power pins 37 when the plug is moved to the storage position P2, and the first case 10 is connected to the second case 20 (FIG. 6).

When the first case 10 engages the second case 20, it hides the first connector 30 and the second connector 50 in a space between the first and the second cases 10, 20, and only the line 40 is left out of the first and the second cases 10, 20. It could hang the transmission cable 100 of the present invention on a specific place, on the user may wear the transmission cable 100 on his/her neck.

Figure 7:
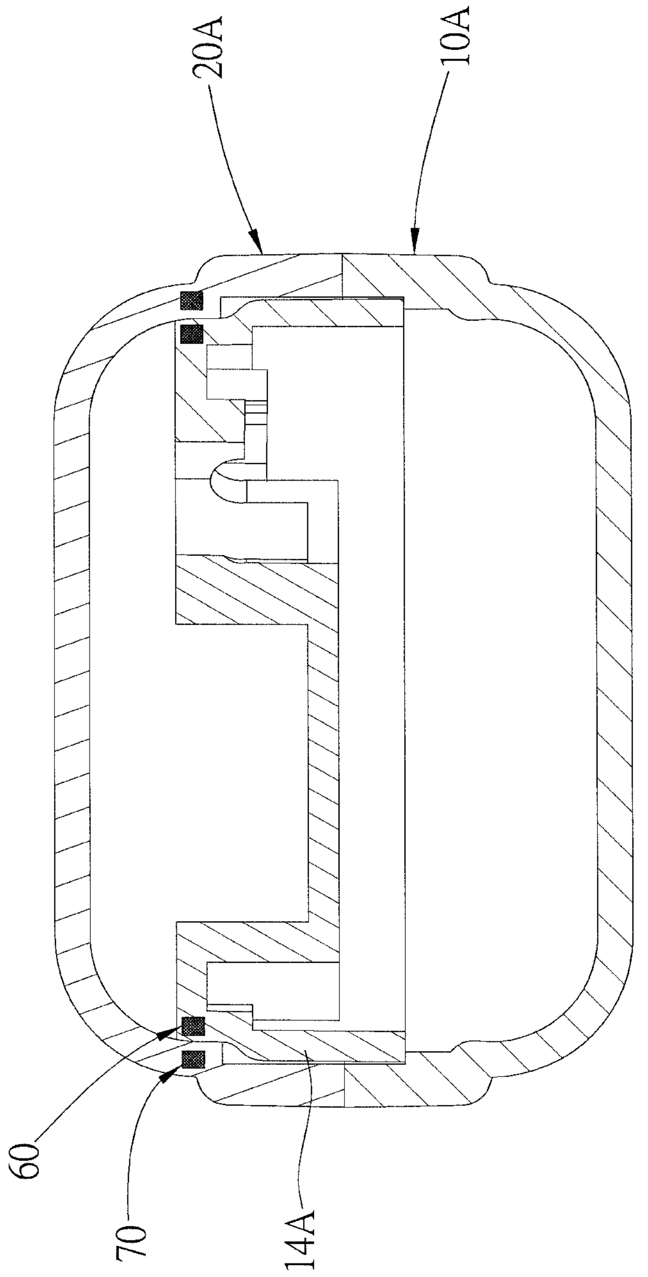
FIG. 7 is a sectional view of the preferred embodiment of the present invention, showing the first case and the second case connected by magnetic power.
Figure 8:
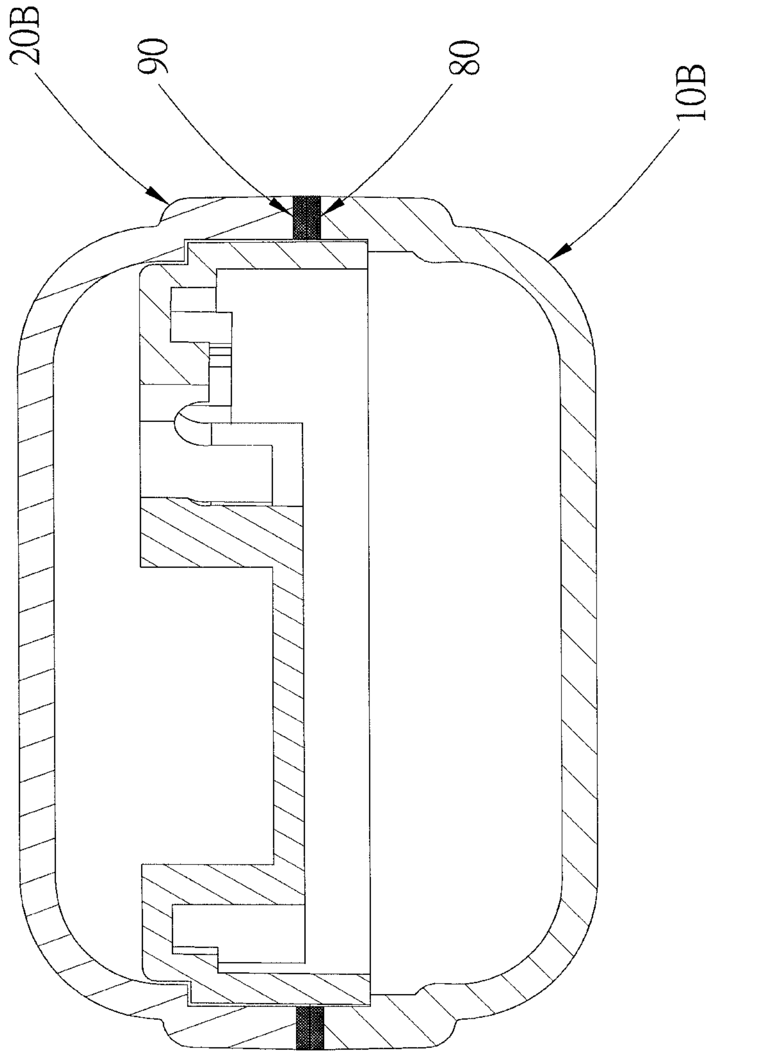
FIG. 8 is a sectional view of the preferred embodiment of the present invention, showing the first case and the second case connected by Velcro.

The above embodiment provides the first and the second cases 10, 20 connected together by the engagement of the mortises 14*c* and the tenons 20*b*. In another embodiment, as shown in FIG. 7, a first case 10A is provided with a first magnetic member 60 on an inner member 14A, and a second case 20A is provided with a second magnetic member 70. As a result, the first and the second cases 10A, 20A could be connected together by a magnetic force of the first and the second magnetic members 60, 70. Yet in another embodiment, as shown in FIG. 8, a first case 10B and a second case 20B are provided with a first Velcro device 80 and a second Velcro device 90 respectively. The Velcro devices 80, 90 are a pair of loops and hooks to be connected and disconnected by manipulation. It achieves the same function of connecting and disconnecting the first case 10B and the second case 20B.

It must be pointed out that the embodiments described above are only some preferred embodiments of the present invention. All equivalent structures which employ the concepts disclosed in this specification and the appended claims should fall within the scope of the present invention.

What is claimed is:

1. A transmission cable for an electrical device, comprising:

a first case;

a second case detachably connected to the first case, wherein a space is formed between the first case and the second case when the first case is connected to the second case;

a line having opposite ends connected to the first case and the second case respectively;

a first connector includes a plug, a circuit board, and a transformer;

the first connector connected to the end of the line connected to the first case;

the plug and the transformer are electrically connected to the circuit board respectively;

a second connector connected to the end of the line connected to the second case;

wherein both the first connector and the second connector are received in the space between the first case and the second case when the first case is connected to the second case;

the first case has an outer member and an inner member, wherein the outer member is connected to the inner member to form a chamber therebetween;

the end of the line connected to the first case is received in the chamber, and the first connector is connected to the inner member; and the plug is pivoted on an outer side of the inner member, and the circuit board and the transformer are received in the chamber of the first case.

2. The transmission cable of claim 1, wherein the first connector further includes an insulating member, a pivoting base, and a conductive plate; the insulating member is between the circuit board and the plug; the pivot base is pivoted on the insulating member, and the plug is connected to the pivot base; the conductive plate is provided on the insulating member to be electrically connected to the plug and the circuit board respectively.

3. The transmission cable of claim 1, wherein the plug has two power pins, and the second connector is received in a space between the power pins when the first case is connected to the second case.

4. The transmission cable of claim 1, wherein the first case is provided with mortises, and the second case is provided with tenons; the tenons respectively engage the mortises when the first case is connected to the second case.

5. The transmission cable of claim 1, wherein the first case is provided with a first magnetic member, and the second case is provided with a second magnetic member; the first magnetic member and the second magnetic member are attracted together by a magnetic force when the first case is connected to the second case.

6. The transmission cable of claim 1, wherein the first case is provided with a first Velcro member, and the second case is provided with a second Velcro member; the first Velcro member and the second Velcro member are engaged together when the first case is connected to the second case.

* * * * *